US012378948B2

(12) United States Patent
Divigalpitiya et al.

(10) Patent No.: US 12,378,948 B2
(45) Date of Patent: Aug. 5, 2025

(54) ACTUATOR COMPRISING ELECTRICALLY CONDUCTIVE POROUS MATERIAL

(71) Applicant: HydroGraph Clean Power Inc., Toronto (CA)

(72) Inventors: Ranjith Divigalpitiya, London (CA); Jun Wang, London (CA)

(73) Assignee: HydroGraph Clean Power Inc., Toronto (CA)

( * ) Notice: Subject to any disclaimer, the term of this patent is extended or adjusted under 35 U.S.C. 154(b) by 0 days.

(21) Appl. No.: 18/223,811

(22) Filed: Jul. 19, 2023

(65) Prior Publication Data
US 2024/0026865 A1    Jan. 25, 2024

Related U.S. Application Data

(60) Provisional application No. 63/390,734, filed on Jul. 20, 2022.

(51) Int. Cl.
*F03G 7/00* (2006.01)
*B81B 3/00* (2006.01)

(52) U.S. Cl.
CPC .......... *F03G 7/0121* (2021.08); *B81B 3/0021* (2013.01); *B81B 2201/038* (2013.01)

(58) Field of Classification Search
CPC .................................................. F03G 7/0121
See application file for complete search history.

(56) References Cited

U.S. PATENT DOCUMENTS 3,395,241 A    7/1968 Roman
4,257,157 A    3/1981 Pollock et al.
(Continued)

FOREIGN PATENT DOCUMENTS

CN    104393165 A  *  3/2015
CN    104912760 A  *  9/2015
(Continued)

OTHER PUBLICATIONS

Liu Q, Liu L, Kuang J, Dai Z, Han J, Zhang Z. Nanostructured carbon materials based electrothermal air pump actuators. Nanoscale. Jun. 21, 2014; 6(12) :6932-6938. doi: 10.1039/c4nr00536h. PMID: 24839084, https://doi.org/10.1039/C4NR00536H (Year: 2014).*
Lin et al., "Pristine Graphene Aerogels by Room-Temperature Freeze Gelation," Advanced Materials, vol. 28, pp. 7993-8000, 2016, (9 pages).
Dhaubhadel et al., "Aerosol Gelation: Synthesis of a Novel, Lightweight, High Specific Surface Area Material," Aerosol Science and Technology, vol. 41, pp. 804-810, 2007, (8 pages).
(Continued)

*Primary Examiner* — Laert Dounis
(74) *Attorney, Agent, or Firm* — Carter, DeLuca & Farrell, LLP; George Likourezos

(57) ABSTRACT

An actuator device comprises an enclosed volume region defined by a housing body and a movable surface, such that at least a portion of the enclosed volume region is expandable from an initial volume state to an enlarged volume state. An electrically conductive porous material is disposed in the enclosed volume region, wherein the electrically conductive porous material has a mass density of from about 0.5 mg/cc to about 100 mg/cc, and wherein at least about 90% of the electrically conductive porous material is a carbonaceous material. A first electrode and a second electrode are configured to pass an electric current through the electrically conductive porous material. When an electric current is passed through the electrically conductive porous material, air disposed in the enclosed volume region expands and displaces the movable surface. A method of displacing a movable surface in an actuator device is also described.

30 Claims, 10 Drawing Sheets

(56) References Cited

U.S. PATENT DOCUMENTS

| | | |
|---|---|---|
| 6,948,800 B2 | 9/2005 | Cabal et al. |
| 7,300,958 B2 | 11/2007 | Kataoka et al. |
| 7,331,273 B2 | 2/2008 | Kerekes et al. |
| 7,361,430 B1 | 4/2008 | Gennett et al. |
| 7,691,909 B2 | 4/2010 | Sorenson et al. |
| 8,454,321 B2 | 6/2013 | Ingersoll et al. |
| 8,748,768 B2 | 7/2014 | Cai et al. |
| 9,368,709 B2 | 6/2016 | Brokken et al. |
| 9,440,857 B2 | 9/2016 | Sorensen et al. |
| 9,738,527 B2 | 8/2017 | Li et al. |
| 9,878,911 B2 | 1/2018 | Maisels et al. |
| 10,465,723 B2 | 11/2019 | Ilievski et al. |
| 11,022,066 B2 | 6/2021 | Nojeh et al. |
| 2009/0100832 A1* | 4/2009 | Loeffler ............ F01K 25/08 60/512 |
| 2010/0230298 A1* | 9/2010 | Biener ............ C01B 3/0021 204/248 |
| 2011/0133607 A1 | 6/2011 | Lee et al. |
| 2012/0034442 A1 | 2/2012 | Pauzauskie et al. |
| 2020/0280092 A1* | 9/2020 | Pszolla ............ H01M 10/0563 |
| 2023/0228261 A1* | 7/2023 | Schuett ............ H05B 3/12 137/67 |

FOREIGN PATENT DOCUMENTS

| | | | |
|---|---|---|---|
| CN | 106976861 A | * | 7/2017 |
| DE | 10229958 A1 | | 1/2004 |
| JP | H07146033 A | | 6/1995 |
| JP | 2000009105 A | | 1/2000 |
| JP | 2013092087 A | | 5/2013 |
| JP | 2017144009 A | | 8/2017 |
| WO | 2013029094 A1 | | 3/2013 |
| WO | 2017076979 A1 | | 5/2017 |

OTHER PUBLICATIONS

Dhaubhadel, "An Experimental Study of Dense Aerosol Aggregations," Kansas State University, 2008, (288 pages).

Wright et al., "Synthesis of turbostratic nanoscale graphene via chamber detonation of oxygen/acetylenemixtures," Nano Select vol. 3, Issue 6, pp. 1-15, Nov. 2021, (15 pages).

Mohammadbeigi et al., "Observations of Radiation-Dominated Rapid Cooling of Structures Based on Carbon Nanotubes and Graphene," Advanced Engineering Materials, vol. 22, Mar. 2020, (8 pages).

Product Data Sheet, Product Name: Fractal Graphene, HydroGraph Clean Power Inc., Jan. 2022, (3 pages).

Qiao et al., "A review of electromechanical actuators for More/All Electric aircraft systems," Mechanical Engineering Science, vol. 232, No. 22, pp. 4128-4151, 2018, (24pages).

Lushnikov et al., "Experimental observation of the aerosol-aerogel transition," Chemical Physics Letters, vol. 175, No. 1,2, pp. 138-142, Nov. 1990, (5 pages).

International Search Report and Written opinion for National Application No. PCT/CA2023/050966, mailed Oct. 5, 2023, (12 pages).

* cited by examiner

ACTUATOR COMPRISING ELECTRICALLY CONDUCTIVE POROUS MATERIAL

CROSS-REFERENCE TO RELATED APPLICATIONS

The present application claims the benefit of commonly owned provisional application: Ser. No. 63/390,734, filed on Jul. 20, 2022; wherein the entirety of the said provisional application is incorporated herein by reference.

FIELD

The present invention relates to actuators. More specifically, the present application relates to actuators comprising electrically conductive porous material.

BACKGROUND

An actuator is a part of a device or machine that achieves physical movements by converting energy, such as electrical, pneumatic or hydraulic, into a mechanical force. Mechanical actuators are typically pneumatic, hydraulic or fluidic in the macroscopic scale. Other types of actuators, known as soft actuators, such as electro-active polymers, or electrochemical systems generally operate at small scale and made with materials that respond to external stimuli, e.g., electricity, pH, ionic concentration, and light. Electrical actuators use motors in some instances. Historically, steam was used for converting thermal energy into mechanical energy. Also, internal combustion has been used throughout two centuries for similar conversion of energy into a mechanical force.

Pneumatic actuators are described in U.S. Pat. No. 7,331,273, wherein the actuator has a flexible plate, the flexible plate being made of a rigid flexible material. The pneumatic actuator further includes at least two elongate, flexible but poorly extensible pneumatic pressure ducts that are disposed side by side and are in parts connected to the flexible plate to which they are secured and on which they are arranged in such a manner that, when the pressure ducts are pressurized with compressed gas, tangential forces are generated parallel to the flexible plate causing said flexible plate to bend.

U.S. Pat. No. 10,465,723 describes a soft robotic device includes a flexible body having a width, a length and a thickness, wherein the thickness is at least 1 mm, the flexible body having at least one channel disposed within the flexible body, the channel defined by upper, lower and side walls, wherein at least one wall is strain limiting; and a pressurizing inlet in fluid communication with the at least one channel, the at least one channel positioned and arranged such that the wall opposite the strain limiting wall preferentially expands when the soft robotic device is pressurized through the inlet. The source of pressure for operation of the soft robotic device is only generally discussed as including a microcompressor and a water electrolyzer.

High performance graphene oxide electromechanical actuators are described in WO 2013/029094, wherein the actuator comprises graphene oxide that elongates and/or contracts on charge injection. The graphene oxide can have a zig-zag configuration whereby the oxygen atoms of the graphene oxide are aligned along the zig-zag direction of the graphene lattice or an armchair configuration whereby the oxygen atoms of the graphene oxide are aligned along the armchair direction of the graphene lattice. The actuators as described therein operate by the physical elongation and/or contraction of the graphene oxide itself on charge injection.

SUMMARY

An actuator device comprises an enclosed volume region defined by a housing body and a movable surface, such that at least a portion of the enclosed volume region is expandable from an initial volume state to an enlarged volume state. An electrically conductive porous material is disposed in the enclosed volume region, wherein the electrically conductive porous material has a mass density of from about 0.5 mg/cc to about 100 mg/cc, and wherein at least about 90% of the electrically conductive porous material is a carbonaceous material. A first electrode and a second electrode are configured to pass an electric current through the electrically conductive porous material. When an electric current is passed through the electrically conductive porous material, air disposed in the enclosed volume region expands and displaces the movable surface. A method of displacing a movable surface in an actuator device is also described.

Actuators as described herein advantageously can be configured to operate without valves, combustion, exhaust, and gears or management of multiple inlets and outlets as may be required in conventional actuators. Elimination of excess mechanical components such as conventionally required is beneficial in reduction of size, weight and noise generated during operation of the actuator. In particular, reduction of size and/or weight alone can lead to substantial reduction in energy consumption, for example in actuators used in automobile and aviation applications. Reduction in noise generation is particularly advantageous, since noise pollution is a serious concern.

Since the present actuators function by passing electric current through the electrically conductive porous material to expand the air disposed in the enclosed volume region, no undesirable by-products are generated by operation, for example, of internal combustion engines. The present actuators therefore may provide substantial benefits to the environment as compared to operation of certain conventional actuators. Moreover, the present actuators simply operate by expansion of air, and so do not contain potentially harmful fluids that may pose a health risk to workers or cause environmental damage due to fluid leaking and corrosion. Additionally, the present actuators advantageously do not contain potentially harmful hydraulic fluids, substantially reducing the cost and time involved in maintenance and repair of the actuators.

In an embodiment, the enclosed volume region is a closed system, wherein substantially no air is introduced to the enclosed volume region during the operational lifetime of the actuator. In this embodiment, no air control inlet or outlet control valves are required, thereby substantially simplifying operation and maintenance of the actuator.

BRIEF DESCRIPTION OF THE DRAWINGS

The accompanying drawings, which are incorporated in and constitute a part of this application, illustrate several embodiments of the invention and together with a description of the embodiments serve to explain the principles of the invention. A brief description of the drawings is as follows.

DETAILED DESCRIPTION

The embodiments of the present invention described below are not intended to be exhaustive or to limit the invention to the precise forms disclosed in the following detailed description. Rather a purpose of the embodiments chosen and described is by way of illustration or example, so that the appreciation and understanding by others skilled in the art of the general principles and practices of the present invention can be facilitated.

Figure 1:
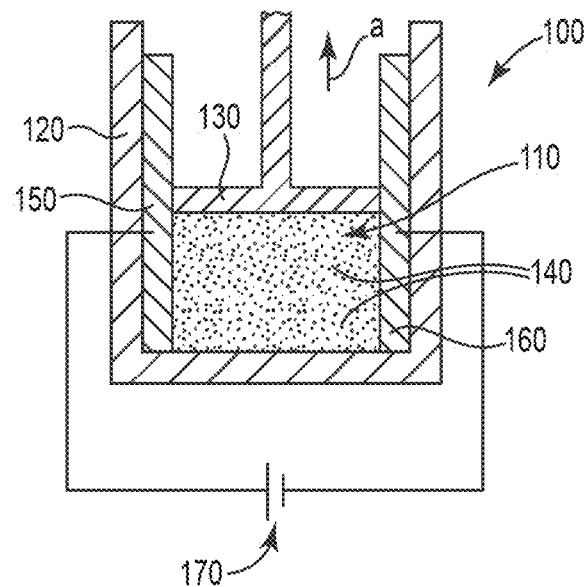
FIG. 1 is an illustration of an embodiment of an actuator with an enclosed volume region in an initial volume state.
Figure 2:
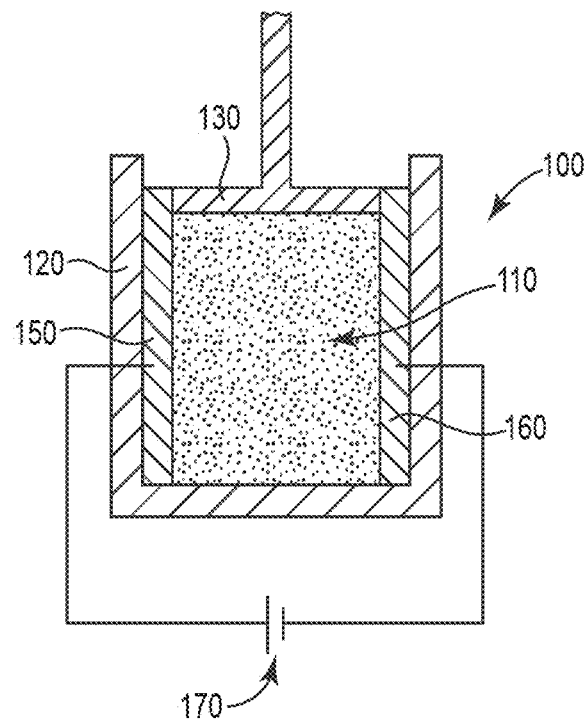
FIG. 2 is an illustration of the embodiment of the actuator shown in FIG. 1 with the enclosed volume region in an enlarged volume state.

Turning now to the Figures, FIG. 1 and FIG. 2 illustrate an embodiment of actuator 100 having an enclosed volume region 110 defined by housing body 120 and movable surface 130. As shown, movable surface 130 is provided as a piston that is slidable within housing body 120 while maintaining an air-tight seal with housing body 120. By movement of movable surface 130, at least a portion of the enclosed volume region is expandable from an initial volume state to an enlarged volume state. Actuator 100 as shown in FIG. 1 is in the initial volume state.

As shown, the housing body is a cylindrical body having a circular cross-section comprising a first base circular base, and the movable surface is a circular piston fitted to the cylindrical body. In alternative embodiments, the housing body may have any desired cross-sectional shape, such as circular, oval, square, rectangular, polygonal, and so forth, with a corresponding piston shape configured to be is slidable within the housing body while maintaining an air-tight seal with housing body.

Electrically conductive porous material 140 is disposed in enclosed volume region 110. Electrically conductive porous material 140 has a mass density of from about 0.5 mg/cc to about 100 mg/cc, and at least about 90% of the electrically conductive porous material is a carbonaceous material.

First electrode 150 and a second electrode 160 are configured to pass an electric current through the electrically conductive porous material. First electrode 150 and a second electrode 160 are disposed on opposing portions of the housing and facing the enclosed volume region. As shown, first electrode 150 and a second electrode 160 are electrode are disposed on opposing side portions of the housing. As shown, the current is provided using DC voltage source 170. Alternatively, the current may be provided by an AC voltage source.

In use, an electric potential is applied across the first electrode and the second electrode, thereby passing an electric current through the electrically conductive porous material, causing the electrically conductive porous material to heat up by Joule heating. This heating in turn significantly heats up the air in the enclosed volume region, causing the air to expand and displace the movable surface in an upward direction a, expanding the enclosed volume region from an initial volume state as shown in FIG. 1 to an enlarged volume state as shown in FIG. 2.

Electrically conductive porous material 140 is disposed in enclosed volume region 110 in an amount to at least physically contact both first electrode 150 and a second electrode 160 so that electric current may pass from one electrode to the other through the electrically conductive porous material. Advantageously, electrically conductive porous material 140 is disposed in enclosed volume region 110 to completely fill the enclosed volume region 110, thereby maximizing proximity of the electrically conductive porous material to all air inside the volume and facilitating rapid heating of the air inside the volume, promoting uniform and rapid air expansion to provide efficient generation of actuating force.

Figure 3:
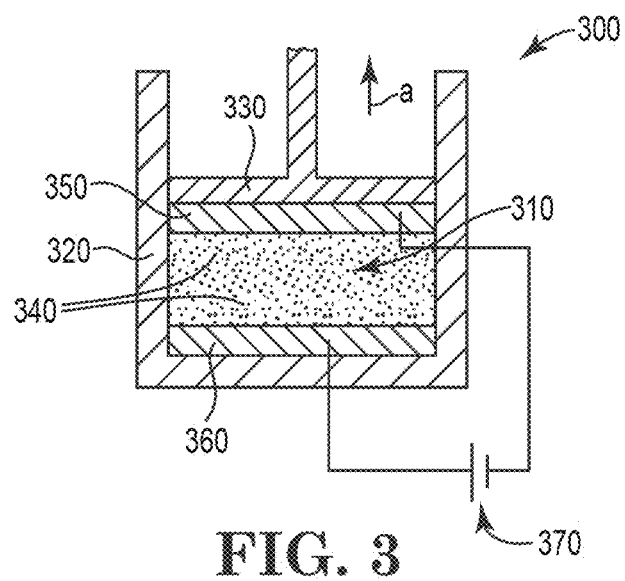
FIG. 3 is an illustration of an embodiment of an actuator with an enclosed volume region in an initial volume state.
Figure 4:
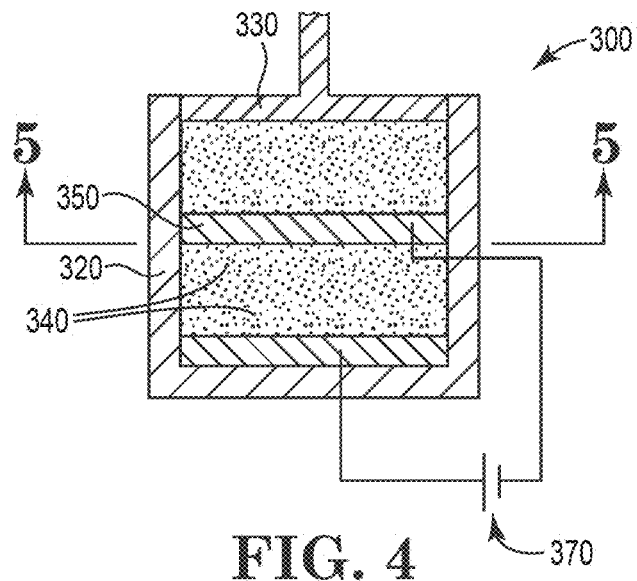
FIG. 4 is an illustration of the embodiment of the actuator shown in FIG. 3 with the enclosed volume region in an enlarged volume state.
Figure 5:
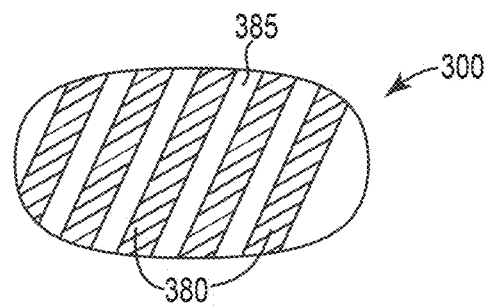
FIG. 5 is a sectional view of the embodiment of the actuator shown in FIG. 4 taken along line 5-5.

An alternate configuration is shown in FIG. 3 and FIG. 4, wherein actuator 300 having an enclosed volume region 310 is defined by housing body 320 and movable surface 330. As shown, movable surface 330 is provided as a piston that is slidable within housing body 320 while maintaining an air-tight seal with housing body 320. By movement of movable surface 330, at least a portion of the enclosed volume region is expandable from an initial volume state to an enlarged volume state. Actuator 300 as shown in FIG. 3 is in the initial volume state.

As shown, the housing body is a cylindrical body having a circular cross-section comprising a first base circular base, and the movable surface is a circular piston fitted to the cylindrical body. Electrically conductive porous material 340 is disposed in enclosed volume region 310.

First electrode 350 and a second electrode 360 are configured to pass an electric current through the electrically conductive porous material. First electrode 350 and a second electrode 360 are disposed on opposing portions of the housing and facing the enclosed volume region. As shown, first electrode 360 is disposed on the first base circular base on a surface facing the enclosed volume region 310 and the second electrode 350 is disposed adjacent the circular piston 330 on a surface facing the enclosed volume region 310. Second electrode 350 is shown in the sectional view of the embodiment of the actuator shown in FIG. 4 taken along line 5-5, wherein electrode 350 is provided in the form of cross-members 380, comprising void regions 385 to allow air to pass therethrough. It will be understood that the electrode 350 may be provided in any configuration comprising void regions to allow air to pass therethrough, such as a cross-hatched pattern or the like.

As shown, the current is provided using DC voltage source 370. Alternatively, the current may be provided by an AC voltage source.

In use, an electric potential is applied across the first electrode and the second electrode, thereby passing an electric current through the electrically conductive porous material, causing the electrically conductive porous material to heat up by Joule heating. This heating in turn significantly heats up the air in the enclosed volume region, causing the air to expand and displace the movable surface in an upward direction a, expanding the enclosed volume region from an initial volume state as shown in FIG. 3 to an enlarged volume state as shown in FIG. 4.

Figure 6:
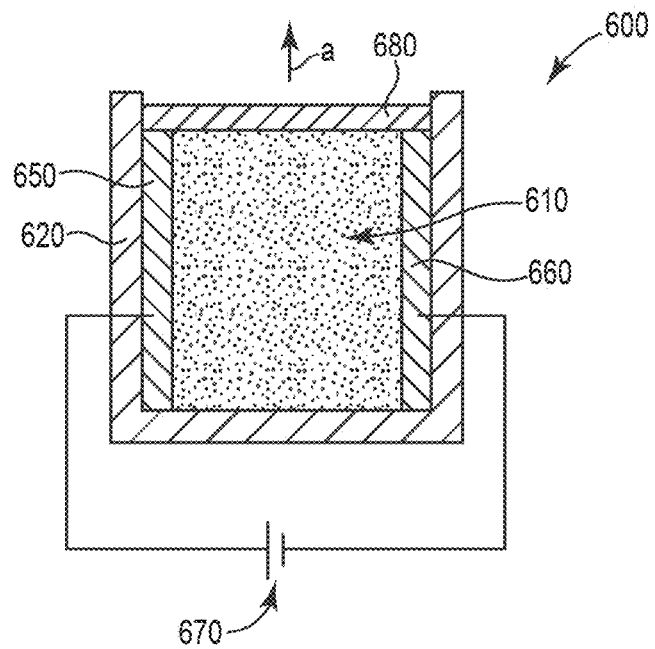
FIG. 6 is an illustration of an embodiment of an actuator with an enclosed volume region in an initial volume state.
Figure 7:
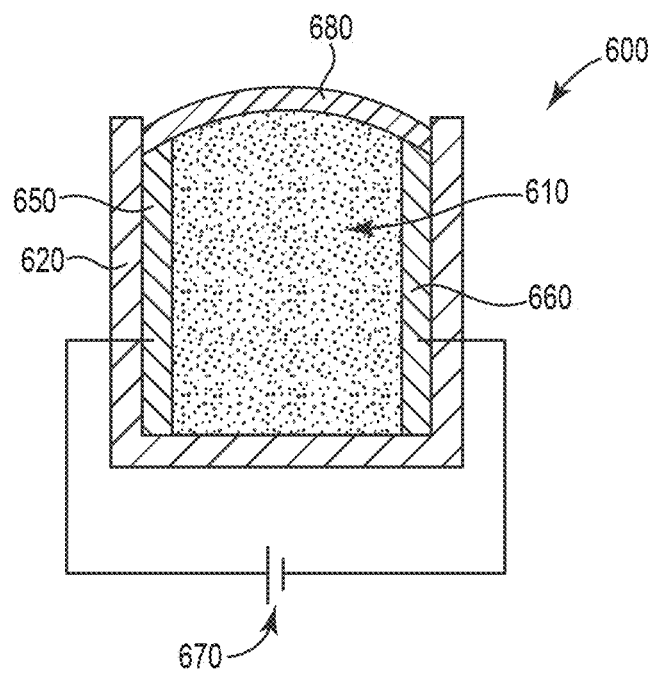
FIG. 7 is an illustration of the embodiment of the actuator shown in FIG. 6 with the enclosed volume region in an enlarged volume state.

An alternate configuration is shown in FIG. 6 and FIG. 7, wherein actuator 600 having an enclosed volume region 610 defined by housing body 620 and movable surface 680. As shown, movable surface 680 is provided as a displaceable wall 680 of the housing body 620 configured to be displaced by expansion of the air disposed in the enclosed volume region 610.

By movement of displaceable wall 680, at least a portion of the enclosed volume region is expandable from an initial volume state to an enlarged volume state. In use, an electric potential is applied across the first electrode and the second electrode, thereby passing an electric current through the electrically conductive porous material, causing the electrically conductive porous material to heat up by Joule heating. This heating in turn significantly heats up the air in the enclosed volume region, causing the air to expand and displace the movable surface in an upward direction a, expanding the enclosed volume region from an initial volume state as shown in FIG. 6 to an enlarged volume state as shown in FIG. 7.

Displaceable wall 680 may be made from any suitable flexible material that will flex in response to the pressure created upon expansion of air. In an embodiment, displaceable wall 680 is made from a material selected from spring steel, Glass Fiber Reinforced Plastic (GFRP), Carbon Fiber-Reinforced Polymers (CFRP), layers of woven fiber webs and plastic, and the like.

Displaceable wall 680 may be an elastomeric membrane, for example, made up of silicone rubber or polyurethane and the like with enough rigidity and flexibility to accommodate expansion but strong enough to remain resilient.

In an embodiment, displaceable wall 680 may be made from butyl rubber.

As noted above, the electrically conductive porous material has a mass density of from about 0.5 mg/cc to about 100 mg/cc, and at least about 90% of the electrically conductive porous material is a carbonaceous material.

In an embodiment, the electrically conductive porous material is provided in a physical form selected from the group consisting of a distribution of particles, a distribution of aggregated particles, a porous skeletal structure, or a mixture thereof. In an embodiment, the electrically conductive porous material comprises particles in a physical form selected from the group consisting of carbon nanotubes, carbon nanohorns, carbon nanosheets, fullerenes, carbon spheroidal particles, carbon polyhedral particles carbon multilayer sheets comprising from 2 to 30 layers, turbostratic carbon particles, and mixtures thereof.

In an embodiment, the carbon particles are provided as an interparticle aggregate structure formed by van der Waals-London type dispersion forces. In an embodiment, the carbon particles are provided as an agglutinate structure, where the carbon nanoparticles are firmly held together to form the agglutinate by agglutination forces much larger than van der Waals forces. Preparation of aggregate structures and agglutinate structures are described, for example, in U.S. Pat. No. 7,300,958, the disclosure of which is incorporated by reference herein.

In an embodiment, the carbon particles are carbon aerogel particles prepared by carbonizing an organic resin to form particles. In an embodiment, the carbon particles are carbon aerogel particles prepared by (A) reacting a mono- and/or polyhydroxybenzene, an aldehyde and a catalyst in a reactor at a reaction temperature in the range from 75-200° C. at a pressure of 80-2400 kPa, (B) then spraying the reaction mixture from process step (A) into an acid, (C) drying the resulting product from process step (B) and (D) carbonizing it, as described, for example, in U.S. Pat. No. 9,878,911, the disclosure of which is incorporated by reference herein.

In an embodiment, the electrically conductive porous material has a surface area of from about 10 $m^2/g$ to about 550 $m^2/g$. In an embodiment, the electrically conductive porous material has a surface area of from about 200 $m^2/g$ to about 350 $m^2/g$. Additionally, it is noteworthy that since the specific surface area of pure graphene can be as high as 2630 $m^2/g$, and therefore may be the most porous carbonaceous powder material. In an embodiment, the electrically conductive porous material has a surface area of from about 550 $m^2/g$ to about 2630 $m^2/g$. In an embodiment, the electrically conductive porous material has a surface area of from about 800 $m^2/g$ to about 2630 $m^2/g$. In an embodiment, the electrically conductive porous material has a surface area of from about 1000 $m^2/g$ to about 2630 $m^2/g$. In an embodiment, the electrically conductive porous material has a surface area of from about 1500 $m^2/g$ to about 2630 $m^2/g$. In an embodiment, the electrically conductive porous material has a surface area of from about 800 $m^2/g$ to about 2000 $m^2/g$. In an embodiment, the electrically conductive porous material has a surface area of from about 1000 $m^2/g$ to about 2000 $m^2/g$. In an embodiment, the electrically conductive porous material has a surface area of from about 1500 $m^2/g$ to about 2000 $m^2/g$.

In an embodiment, the electrically conductive porous material comprises carbonaceous, electrically conductive particles having an average particle size of from about 10 nm to about 150 nm; or wherein the electrically conductive porous material comprises carbonaceous, electrically conductive particles having an average particle size of from about 10 nm to about 100 nm; or wherein the electrically conductive porous material comprises carbonaceous, electrically conductive particles having an average particle size of from about 50 nm to about 100 nm; or wherein the electrically conductive porous material comprises carbonaceous, electrically conductive particles having an average particle size of from about 30 nm to 60 nm.

In an embodiment, at least about 50% of the electrically conductive porous material is present in the form of carbonaceous, electrically conductive particles having an average particle size of from about 10 nm to about 100 nm. In an embodiment, at least about 60% of the electrically conductive porous material is present in the form of carbonaceous, electrically conductive particles having an average particle size of from about 10 nm to about 100 nm. In an embodiment, at least about 70% of the electrically conductive porous material is present in the form of carbonaceous, electrically conductive particles having an average particle size of from about 10 nm to about 100 nm. In an embodiment, at least about 80% of the electrically conductive porous material is present in the form of carbonaceous, electrically conductive particles having an average particle size of from about 10 nm to about 100 nm. In an embodiment, at least about 90% of the electrically conductive porous material is present in the form of carbonaceous, electrically conductive particles having an average particle size of from about 10 nm to about 100 nm. In an embodiment, at least about 95% of the electrically conductive porous material is present in the form of carbonaceous, electrically conductive particles having an average particle size of from about 10 nm to about 100 nm.

In an embodiment, the electrically conductive porous material comprises carbonaceous, electrically conductive particles having a mass density of from about 3 mg/cc to about 90 mg/cc. In an embodiment, the electrically conductive porous material comprises carbonaceous, electrically conductive particles having a mass density of from about 10 mg/cc to about 90 mg/cc. In an embodiment, the electrically conductive porous material comprises carbonaceous, electrically conductive particles having a mass density of from about 40 mg/cc to about 90 mg/cc.

In an embodiment, the enclosed volume region of the actuator device comprises a volume fraction of air of from about 10% to 98%. In an embodiment, the enclosed volume region comprises a volume fraction of air of from about 30% to 98%. In embodiments, the enclosed volume region comprises a volume fraction of air of from about 50% to 98%. In an embodiment, the enclosed volume region comprises a volume fraction of air of from about 70% to 98%. In an embodiment, the enclosed volume region comprises a volume fraction of air of from about 80% to 98%. In an embodiment, the enclosed volume region comprises a volume fraction of air of from about 90% to 98%. In an embodiment, the enclosed volume region comprises a volume fraction of air of from about 95% to 98%.

In an embodiment, the electrically conductive porous material of the actuator device has a conductivity of from about 1 S/m to about $5 \times 10^7$ S/m.

In an embodiment, the electrically conductive porous material of the actuator device has a conductivity of from about 1 S/m to about 1000 S/m. In an embodiment, the electrically conductive porous material has a conductivity of from about 1 S/m to about 400 S/m.

In an embodiment, the electrically conductive porous material of the actuator device has a conductivity of from about 1000 S/m to about $5 \times 10^7$ S/m. In an embodiment, the electrically conductive porous material of the actuator device has a conductivity of from about $1 \times 10^4$ S/m to about $5 \times 10^7$ S/m. In an embodiment, the electrically conductive porous material of the actuator device has a conductivity of from about $1 \times 10^5$ S/m to about $5 \times 10^7$ S/m. In an embodiment, the electrically conductive porous material of the actuator device has a conductivity of from about $1 \times 10^6$ S/m to about $5 \times 10^7$ S/m.

In an embodiment, the electrically conductive porous material is selected to provide expansion of the enclosed volume region at least about 10% when an electric current is passed through the electrically conductive porous material; or wherein the electrically conductive porous material is selected to provide expansion of the enclosed volume region at least about 50% when an electric current is passed through the electrically conductive porous material; or wherein the electrically conductive porous material is selected to provide expansion of the enclosed volume region at least about 100% when an electric current is passed through the electrically conductive porous material; or wherein the electrically conductive porous material is selected to provide expansion of the enclosed volume region at least about 200% when an electric current is passed through the electrically conductive porous material.

In an embodiment, the electrically conductive porous material comprises carbon black. An example of a suitable carbon black material is Vulcan XC 72R from Cabot Corporation. In an embodiment, from about 1 to 100 wt % of the electrically conductive porous material is carbon black. In an embodiment, from about 10 to 100 wt % of the electrically conductive porous material is carbon black. In an embodiment, from about to 100 wt % of the electrically conductive porous material is carbon black. In an embodiment, from about 40 to 100 wt % of the electrically conductive porous material is carbon black. In an embodiment, from about 60 to 100 wt % of the electrically conductive porous material is carbon black. In an embodiment, from about 80 to 100 wt % of the electrically conductive porous material is carbon black. In an embodiment, from about 90 to 100 wt % of the electrically conductive porous material is carbon black.

In an embodiment, the electrically conductive porous material comprises activated carbon. In an embodiment, from about 1 to 100 wt % of the electrically conductive porous material is activated carbon. In an embodiment, from about 10 to 100 wt % of the electrically conductive porous material is activated carbon. In an embodiment, from about 20 to 100 wt % of the electrically conductive porous material is activated carbon. In an embodiment, from about 40 to 100 wt % of the electrically conductive porous material is activated carbon. In an embodiment, from about 60 to 100 wt % of the electrically conductive porous material is activated carbon. In an embodiment, from about 80 to 100 wt % of the electrically conductive porous material is activated carbon. In an embodiment, from about 90 to 100 wt % of the electrically conductive porous material is activated carbon.

In an embodiment, the electrically conductive porous material comprises coke. In an embodiment, the coke is derived from coal. In an embodiment, the coke is derived from oil. In an embodiment, the coke is metallurgical coke (otherwise known as "metcoke").

In an embodiment, the electrically conductive porous material comprises graphite. In an embodiment, from about 1 to 100 wt % of the electrically conductive porous material is graphite. In an embodiment, from about 10 to 100 wt % of the electrically conductive porous material is graphite. In an embodiment, from about 20 to 100 wt % of the electrically conductive porous material is graphite. In an embodiment, from about 40 to 100 wt % of the electrically conductive porous material is graphite. In an embodiment, from about 60 to 100 wt % of the electrically conductive porous material is graphite. In an embodiment, from about 80 to 100 wt % of the electrically conductive porous material is graphite; or wherein from about 90 to 100 wt % of the electrically conductive porous material is graphite.

In an embodiment, the electrically conductive porous material comprises particles of porous, graphitized carbon spheres having diameters ranging from about fifty nanometers to a few micrometers and containing an abundance of micropores (e.g., less than 2 nanometers in largest dimension) interconnected with mesopores (e.g., about two to twenty nanometers). Such graphitized carbon particles may be prepared, for example, as described in U.S. Pat. No. 8,784,768, the disclosure of which is incorporated by reference herein.

In an embodiment, the electrically conductive porous material comprises a carbonaceous aerosol gel. For purposes of the present discussion, an aerosol gel is an aggregation of particles from the aerosol phase without chemical reaction between the particles or coalescence of the particles, wherein the aggregating particles form particle clusters (e.g., ramified fractal aggregates) that develop a connectivity network to form a gel. In an embodiment, the carbonaceous aerosol gel is a macroscopic gel network formed from carbonaceous soot. The soot is densified to form fractal aggregates by a process called diffusion limited cluster aggregation (DLCA), having a fractal dimension of D>1.8. See, e.g., Sorensen, C. M. et al., Aerogelation in a Flame Soot Aerosol, Physical Review Letters, vol. 80, No. 8, Feb. 23, 1998; and U.S. Pat. No. 7,691,909, the disclosure of which is incorporated herein by reference.

In an embodiment, the electrically conductive porous material comprises graphene. In an embodiment, from about 1 to 100 wt % of the electrically conductive porous material is graphene. In an embodiment, from about 10 to 100 wt % of the electrically conductive porous material is graphene. In an embodiment, from about 20 to 100 wt % of the electrically conductive porous material is graphene. In an embodiment, from about 40 to 100 wt % of the electrically conductive porous material is graphene. In an embodiment, from about 60 to 100 wt % of the electrically conductive porous material is graphene. In an embodiment, from about 80 to 100 wt % of the electrically conductive porous material is graphene. In an embodiment, from about 90 to 100 wt % of the electrically conductive porous material is graphene.

In an embodiment, the electrically conductive porous material comprises graphene-based foam having a structure defined by a three-dimensional network of interconnected and ordered open cells, the open cells being defined by cell walls, the cell walls (i) being formed of graphene sheets, partially reduced graphene oxide sheets, reduced graphene oxide sheets, or a combination thereof, and (ii) having a thickness defined by the thickness of a plurality of graphene sheets, partially reduced graphene oxide sheets, reduced graphene oxide sheets, or a combination thereof. In an embodiment, the graphene-based foam can be prepared by a process comprising providing a dispersion of graphene sheets, partially reduced graphene oxide sheets, reduced graphene oxide sheets, or a combination thereof in a freeze castable medium, and subjecting the dispersion to freeze casting. Such graphene-based foams may be prepared, for example, as described in U.S. Pat. No. 9,738,527, the disclosure of which is incorporated by reference herein.

In an embodiment, the electrically conductive porous material comprises a graphene-based aerosol gel. Such graphene-based aerosol gels may be prepared, for example, as described in U.S. Pat. No. 9,440,857, the disclosure of which is incorporated by reference herein.

It has been found that graphene based porous materials exhibits superior properties as compared to other carbonaceous materials. Specifically, graphene based porous materials exhibit excellent heating and cooling rates, providing advantageously short actuation times and actuation cycle time. While not being bound by theory, it is believed that graphene based porous materials present a unique combination of physical properties including very low density, high electrical conductivity and high surface area that together operate to provide excellent Joule heating performance. Based on the characteristics of graphene, both heating and cooling performance of graphene based porous materials will be higher than that of carbon black or other carbonaceous materials. It therefore has been found that the use graphene the actuators as described herein advantageously provides excellent performance. It is further expected that the superior heating and cooling performance of graphene will be particularly evident in larger actuator devices, e.g. devices having an initial housing enclosed volume of at least about 500 cc, or devices having an initial housing enclosed volume of at least about 1000 cc, or devices having an initial housing enclosed volume of at least about 1500 cc, or devices having an initial housing enclosed volume of at least about 3000 cc, or devices having an initial housing enclosed volume of at least about 5000 cc.

In an embodiment, the electrically conductive porous material comprises up to 10 wt. % of non-carbon components. In an embodiment, the electrically conductive porous material comprises up to 10 wt. % of non-carbon components selected from the group consisting of boron, nitrogen, aluminum, silicon, and phosphorous.

In an embodiment, the electrically conductive porous material is free of polycyclic aromatic hydrocarbons (PAHs). It has been found that PAHs over time may gum up the moving cylinders, and therefore cause operation problems over time. In an embodiment, electrically conductive porous material has superior overall performance when it is chemically pristine, i.e., does not contain organic contaminants such as PAHs.

In an embodiment, the housing body of the actuator device is fabricated from a material selected from the group consisting of glass, borosilicate glass, ceramic, quartz, and ceramic. In an embodiment, the housing body is constructed with a metal, and is thermally and electrically insulated, for example having a durable ceramic coating on the inside and outside surfaces of the housing body.

In an embodiment, the housing body of the actuator device is insulated to reduce heat loss during actuation.

In an embodiment, the actuator device is configured to apply an electric potential across the first electrode and the second electrode of from about 1V to about 240V; or wherein the device is configured to apply an electric potential across the first electrode and the second electrode of from about 2V to about 10V; or wherein the device is configured to apply an electric potential across the first electrode and the second electrode of from about 5V to about 15V.

In an embodiment, the housing enclosed volume region has an initial volume of from about 1 cc to about 15000 cc. In an embodiment, the housing enclosed volume region has an initial volume of from about 1 cc to about 12000 cc. In an embodiment, the housing enclosed volume region has an initial volume of from about 1 cc to about 10000 cc. In an embodiment, the housing enclosed volume region has an initial volume of from about 1 cc to about 5000 cc. In an embodiment, the housing enclosed volume region has an initial volume of from about 1 cc to about 3000 cc. In an embodiment, the housing enclosed volume region has an initial volume of from about 1 cc to about 1000 cc. In an embodiment, the housing enclosed volume region has an initial volume of from about 1 cc to about 1000 cc. In an embodiment, the housing enclosed volume region has an initial volume of from about 1 cc to about 1000 cc. In an embodiment, the housing enclosed volume region has an initial volume of from about 3 cc to about 300 cc. In an embodiment, the housing enclosed volume region has an initial volume of from about 3 cc to about 200 cc. In an embodiment, the housing enclosed volume region has an initial volume of from about 3 cc to about 100 cc. In an embodiment, the housing enclosed volume region has an initial volume of from about 3 cc to about 50 cc.

In an embodiment, the actuators may be used in parallel to increase the output force, and in series to increase the actuation distance, or in combination of both as required for an application.

It has been discovered that thermal conduction and radiation from the Joule heated electrically conductive porous material and heated air can be major loss mechanisms that adversely affect performance of the actuator. It has been discovered that operation of the device can be improved by minimizing these thermal conduction and radiation pathways. Insulating the outer surface of the cylinders with light weight glass wool (fiber glass) is one method to minimize these thermal conduction and radiation pathways. Another method comprises providing an insulation structure similar to a Thermos® flask, where the actuation mechanism is housed inside a double-walled glass container with surfaces metallized to reduce radiation, and wherein the space between the glass walls is evacuated to reduce radiation loss.

In an embodiment, the enclosed volume region further comprises a supplemental air control system, wherein air may be introduced to and/or withdrawn from the enclosed volume region to further extend displacement of the movable surface to a further enlarged volume state or to assist in returning the movable surface to a volume state that is less than the ultimate enlarged volume state.

In an embodiment, a method of displacing a movable surface in an actuator device comprises providing the actuator device as described herein, and applying an electric potential across the first electrode and the second electrode in an amount sufficient to expand the air disposed in the enclosed volume region and displace the movable surface.

While not being bound by theory, it is believed that the air expansion is obtained by Joule heating (also referred to as resistive or ohmic heating) as the energy of the electric current is converted into heat as it flows through a resistance in the electrically conductive porous material.

EXAMPLES

Example 1. Preparation of Graphene Aerosol Gel Aggregate

Graphene aerosol gel aggregate was prepared as described in U.S. Pat. No. 9,440,857, wherein Graphene nanosheets (GNs) in the form of a powder were prepared from the catalyst-free controlled detonation of $C_2H_2$ gas in the presence of $O_2$ in a cylindrical aluminum chamber equipped with a quartz window of 8.5 cm×1.5 cm. The pre-detonation molar ratios of $O_2/C_2H_2$ was 0.3. The initial chamber pressure was 1 atmosphere. The gases had purities of 98.0% for $C_2H_2$ and 99.0% for $O_2$. During the detonation, the hydrocarbon was first converted into free carbon atoms or ions, which condensed into a nanoparticle carbon aerosol, which in turn quickly aggregated and then finally formed a gel, referred to herein as a Carbon Aerosol Gel (CAG).

Example 2. Demonstration of Efficacy in Borosilicate Glass Tube/Graphite Plunger Model Actuator A borosilicate glass tube having one sealed end was fitted with a copper foil as a first electrical connection. The borosilicate glass tube had an Inner Diameter of 15.92 mm, an outer diameter of 18.37 mm and a tube length of 68.93 mm. 0.4314 g of the CAG of Example 1 was loaded into the tube. A graphite plunger having a plunger diameter of 15.9 mm and a plunger length of 12.81 mm, and was provided with another copper foil attached to the plunger on the inner surface thereof as a second electrical connection. The plunger was inserted into the open end of the tube. The two copper foils were connected to a power supply (one positive terminal and the other to the opposite negative terminal). A thermocouple was placed in the middle of the aggregate through a drilled hole on the glass to permit monitoring of the temperature of the aggregate as a function of time. The graphite plunger was connected to a solid rod that rested on an electronic balance which was used to measure the force generated. The electrical voltage and current through the aggregate, temperature, and force read from the balance were recorded as a function of time with a data acquisition system.

Figure 8A:
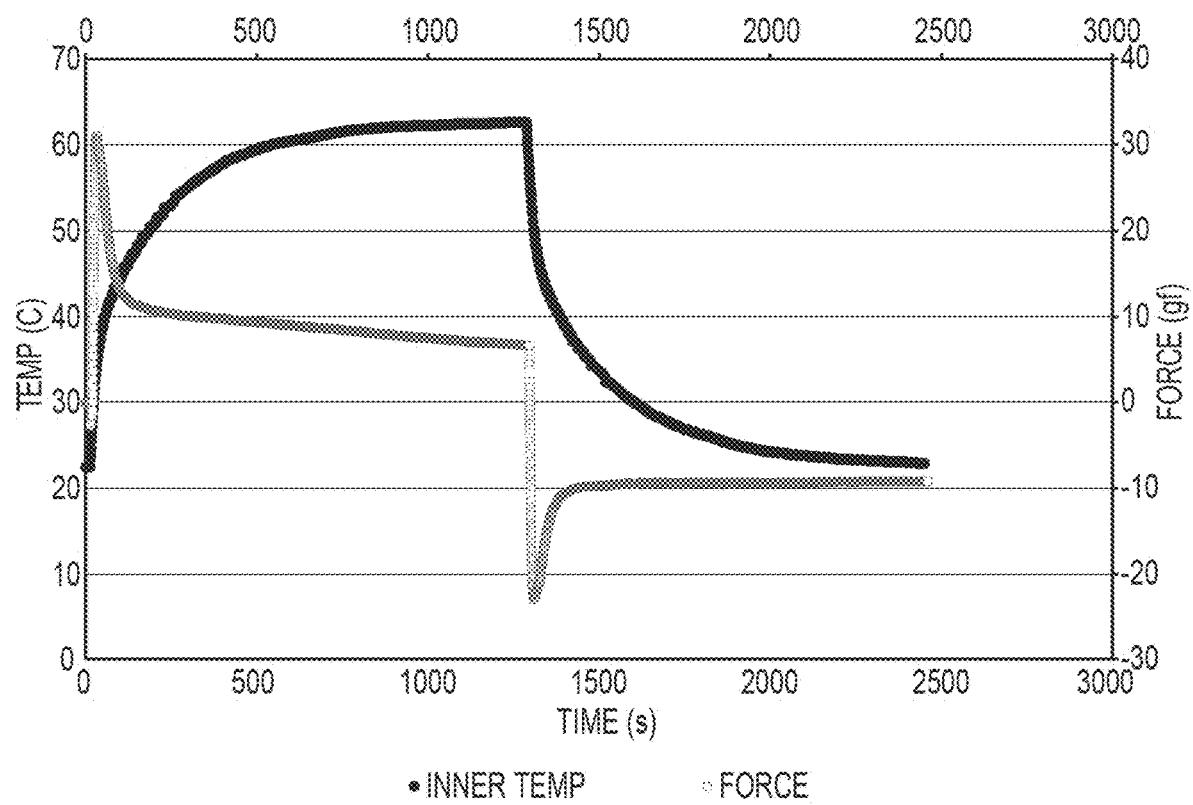
FIG. 8a is a graph showing the measured temperature and force at an input voltage of 5V in an actuator as described herein.
Figure 8B:
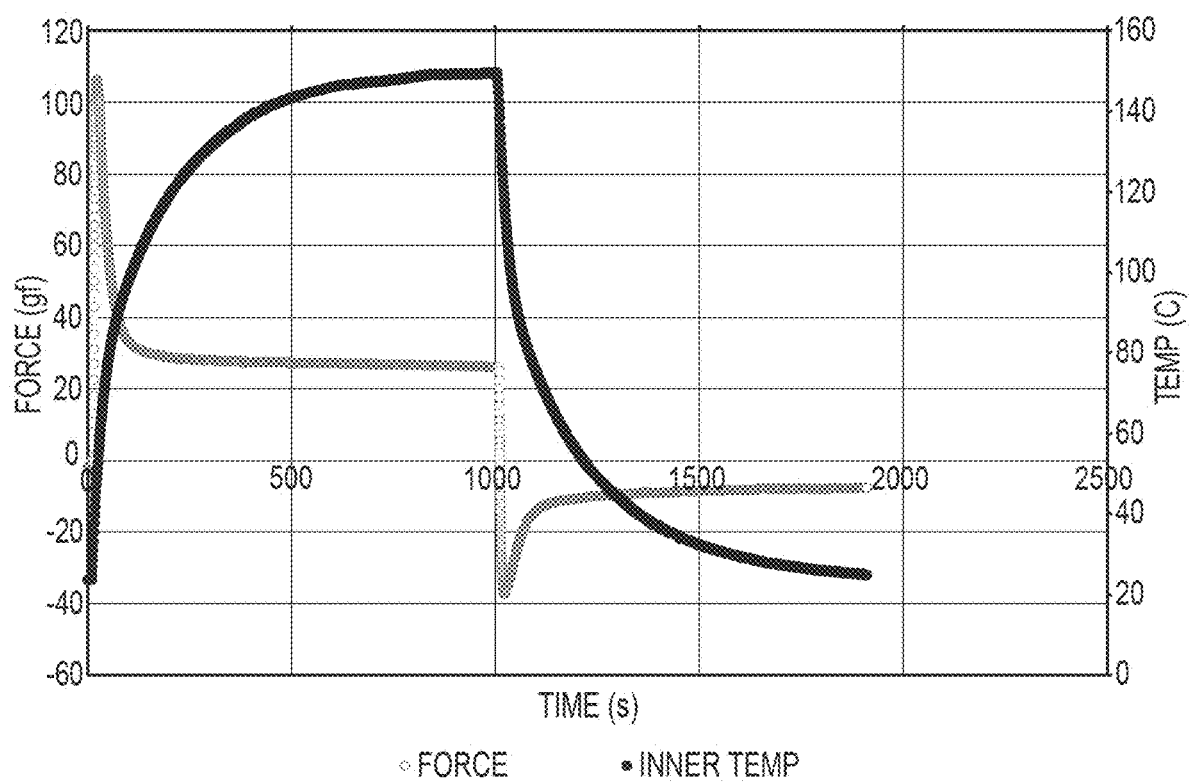
FIG. 8b is a graph showing the measured temperature and force at an input voltage of 9V in an actuator as described herein.

FIG. 8a shows the measured temperature and measured force at an input voltage of 5V, and FIG. 8b shows the measured temperature and measured force at an input voltage of 9V. The force initially increased and followed the temperature profile but abruptly dropped. However, the experiment establishes that the CAG of Example 1 is able to produce significant force in the Model Actuator.

It is believed that the sudden drop in the force as observed was due to air leaking from the cylinder as a result of differential thermal expansion of borosilicate glass and graphite plunger, demonstrating the importance of effective sealing of the actuator in operation of the actuator.

Figure 9:
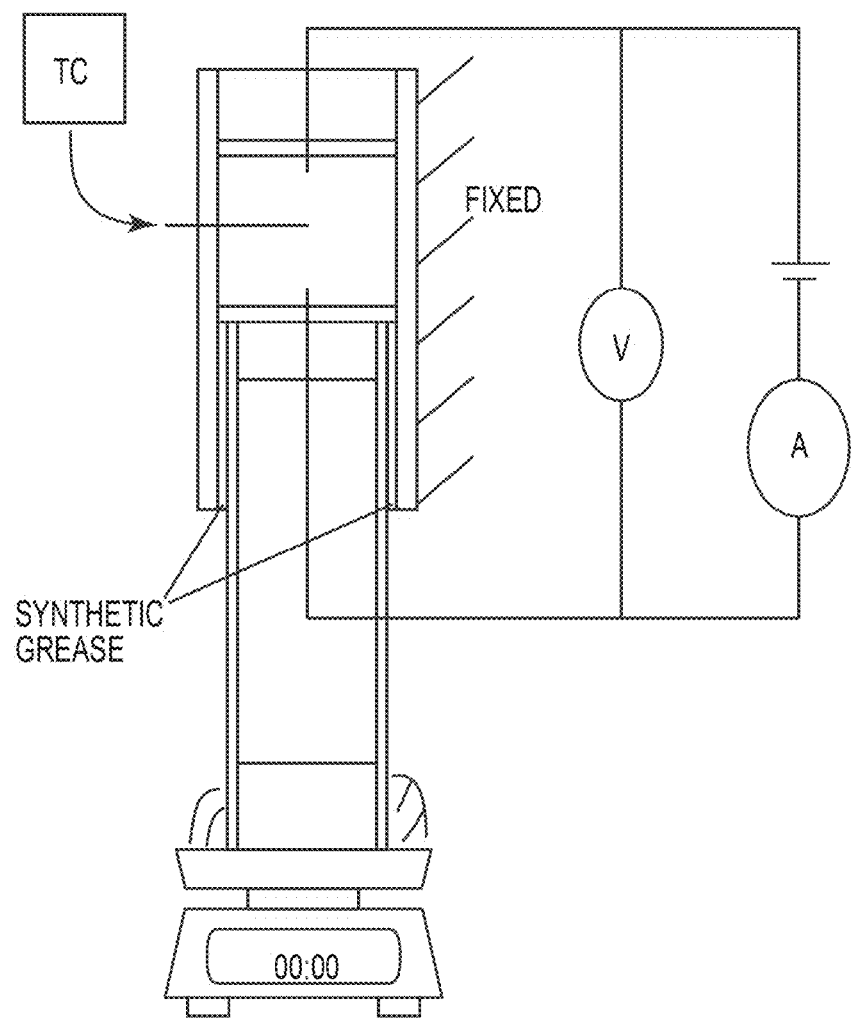
FIG. 9 is an illustration of an embodiment of an actuator with an enclosed volume region.

Example 3. Demonstration of Efficacy in Quartz Tube Plunger Array Model Actuator An alternative Model Actuator was assembled using two quartz tubes with similar inner diameter to the other's outer diameter, such that the smaller tube acting as a plunger was fitted closely inside the larger one. The larger quartz tube had an Inner Diameter of 12.00 mm, an outer diameter of 13.99 mm and a tube length of 61.90 mm. The smaller quartz tube had an Inner Diameter of 10.99 mm, an outer diameter of 11.91 mm and a tube length of 54.98 mm. Since both tubes were of the same material, thermal expansion should be the same and should not let air leak as in Example 2. The tubes were arranged as shown in FIG. 9, and synthetic grease was added to lubricate the glass surfaces. The grease also made the inner cylinder air-tight. Graphene aerosol gel aggregate as described in Example 1 was disposed in the actuator in an amount of 0.1999 g at a density of 74.33 mg/cc.

Figure 10:
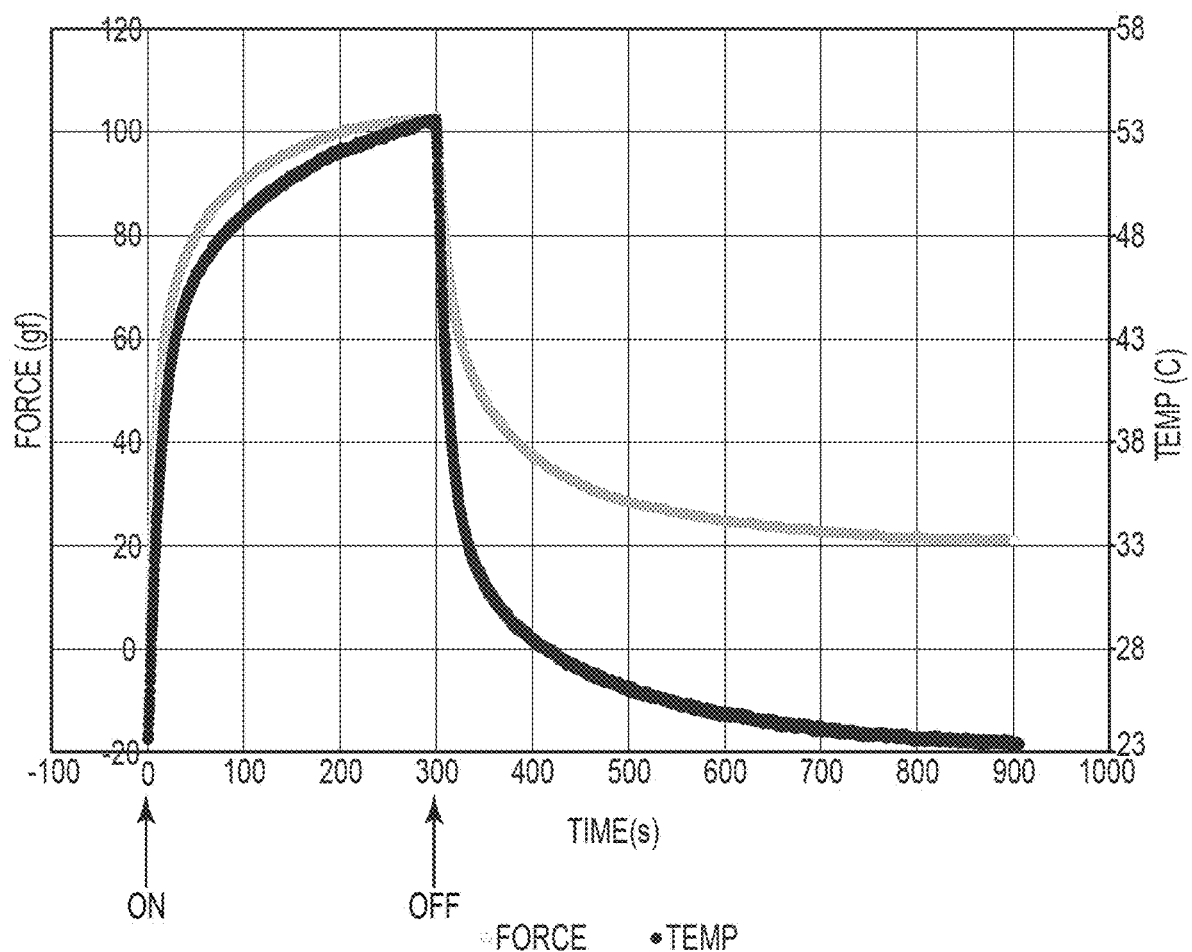
FIG. 10 is a graph showing the measured temperature and force at an input voltage in an actuator as described herein.

Electrical potential (4V) was applied as in Example 2 to the two copper foils at two ends of the CAG of Example 1, and force and temperature measurement were obtained as shown in FIG. 10. This experiment clearly establishes that the force can be extended by properly selecting the materials and design characteristics of the actuator.

Example 4. Demonstration of Cyclability of Actuator

Figure 11:
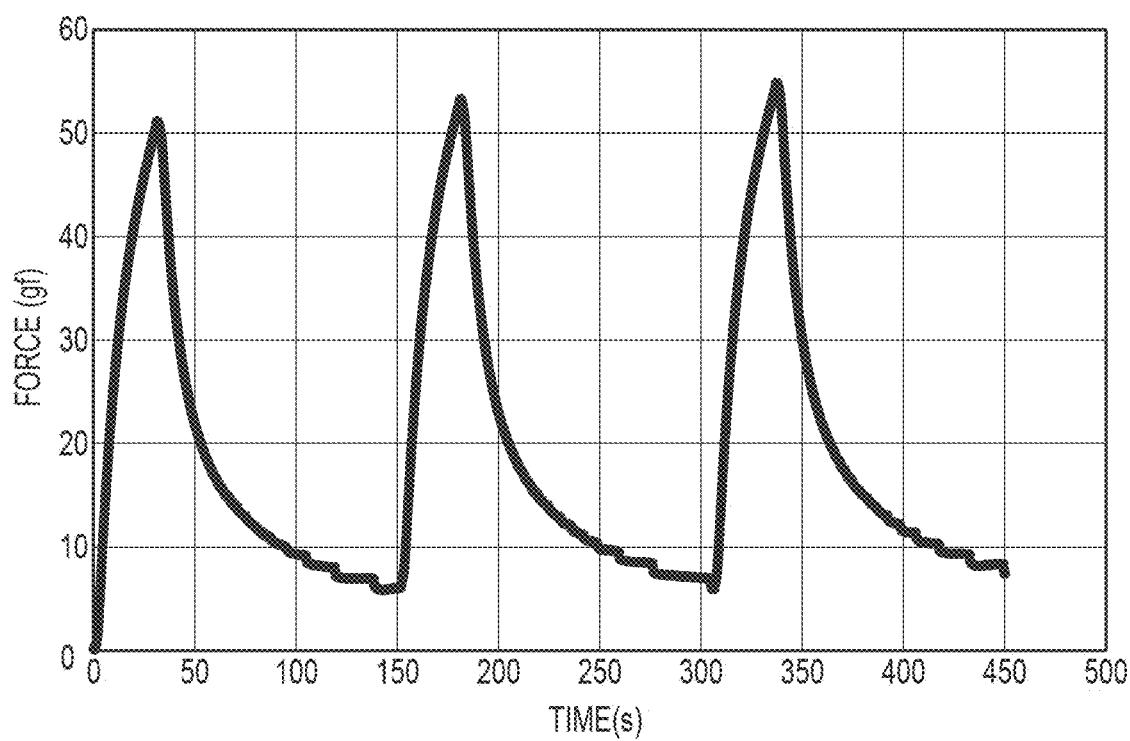
FIG. 11 is a graph showing the measured force upon repetition of the heating and cooling cycles in an actuator as described herein.

The Model Actuator of Example 3 was used to demonstrate cyclability of the actuator. In this example, graphene aerosol gel aggregate as described in Example 1 was disposed in the actuator in an amount of 0.2002 g. Electrical potential was applied in repeated cycles (30 seconds on to heat, 120 seconds off to cool) and the force that was generated was monitored. As can be seen in the results shown in FIG. 11, substantial force is produced upon heating by application of potential, followed by a brief cooling cycle. The amount of force generated by the actuator does not decrease in subsequent repetitions of the heating and cooling cycles.

As demonstrated in previous examples, the transfer of heat to air present in electrically conductive porous materials is rapid. It is believed that the very small interparticle distance in the electrically conductive porous materials, such as graphene fractal aggregate, graphene and other carbonaceous materials, facilitates this rapid heating of the air.

Figure 12:
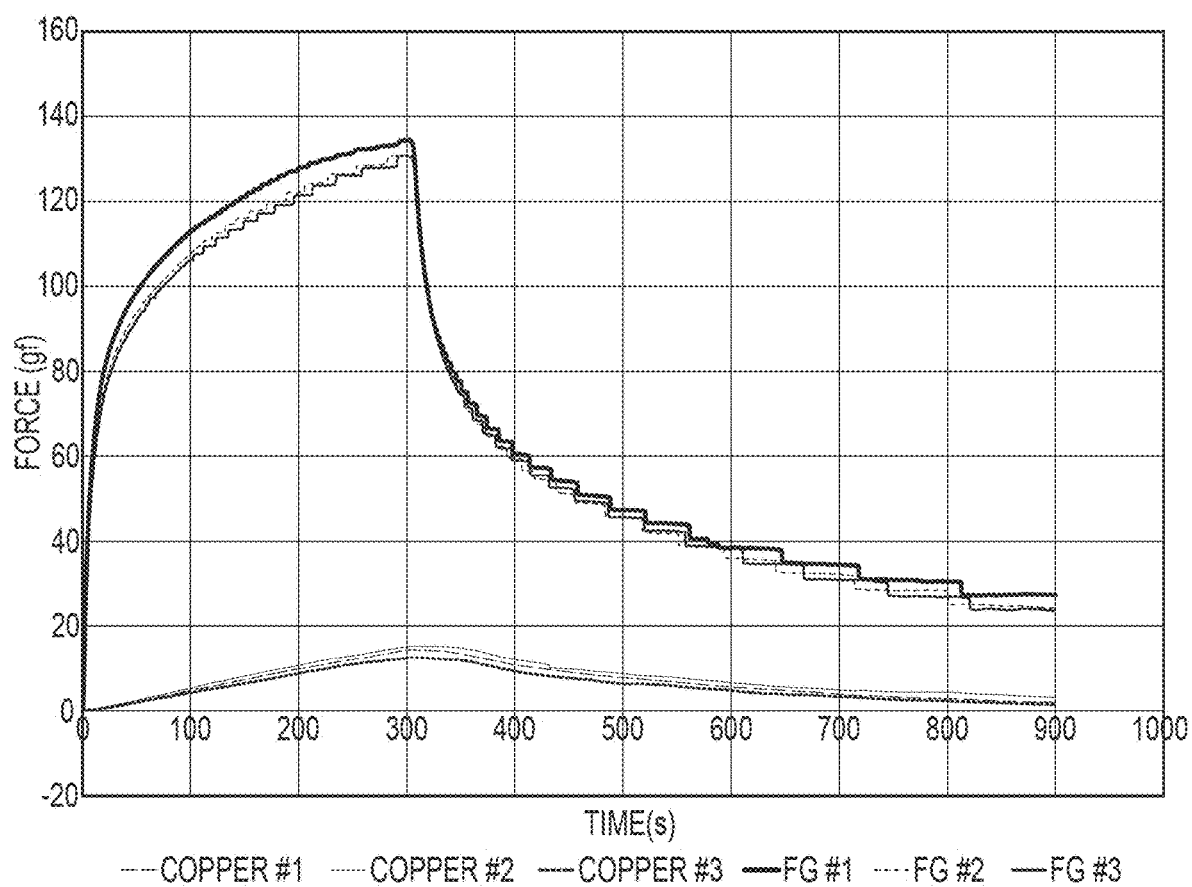
FIG. 12 is a graph showing a comparison of the measured force in an actuator comprising copper powder in comparison to an actuator graphene powder.

Example 5. Demonstration of Superior Thermoelectric Performance of Graphene Powder Compared with Copper Powder The thermoelectric performance of copper powder (SIGMA ALDRICH, St. Louis, MO), which is a non-carbonaceous electrically conducting powder was compared with the graphene powder in example 3. Samples of each powder were prepared for testing by filling the actuator in Example 3 with the same amounts of powder by volume (1.6 c.c.) in each sample (three copper powder samples and three graphene powder samples) to show reproducibility of the experimental results. Current was passed through the powder so that same power was consumed (1 watt) in Joule heating. Force data from this experiment is presented in FIG. 12. The resulting force measured in the actuators as tested indicate that graphene powder produces nearly 10 times as much force as that with copper powder. The measurements additionally show that graphene powder exhibits superior heating rates and cooling rates as compared with copper powder.

Figure 13:
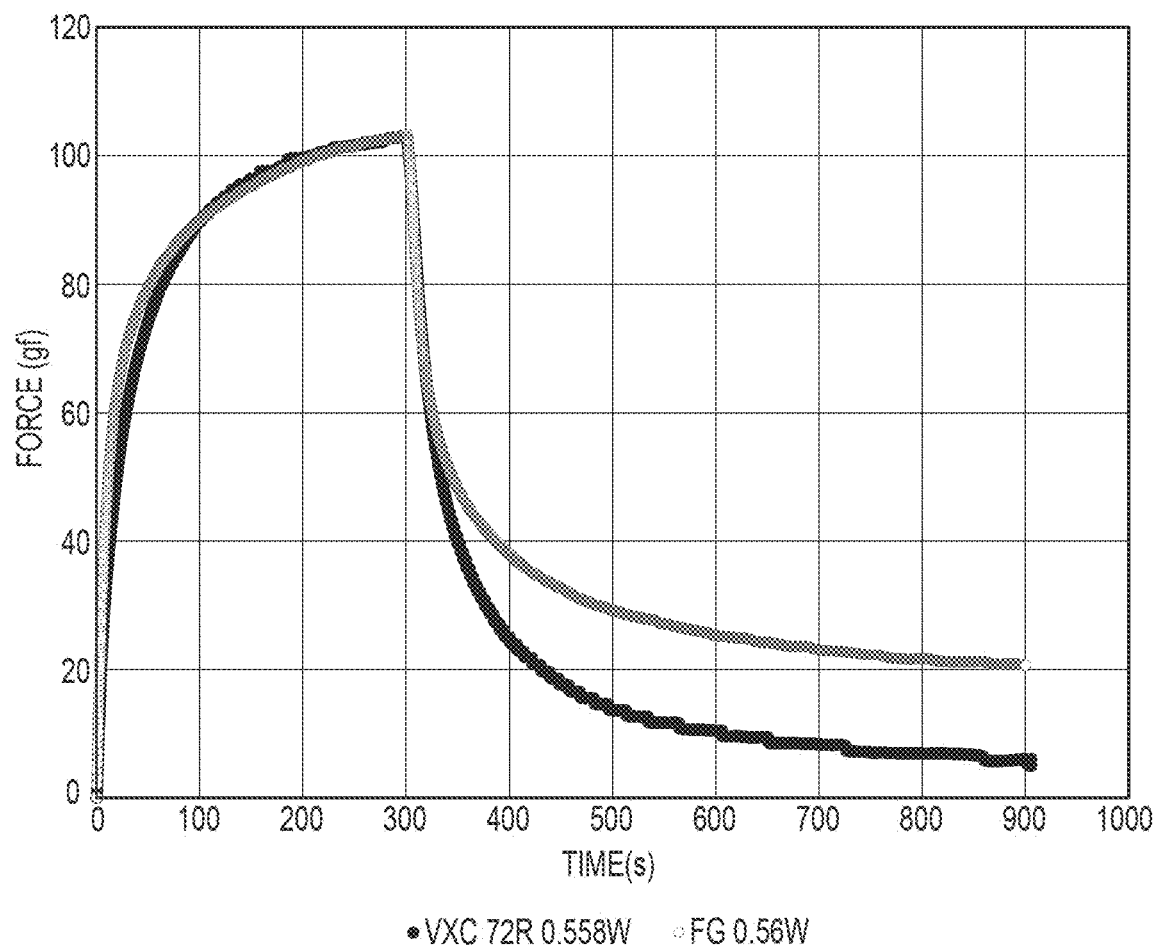
FIG. 13 is a graph showing a comparison of the measured force in an actuator comprising carbon black powder in comparison to an actuator graphene powder.

Example 6. Demonstration of Efficacy of Carbon Black as Electrically Conductive Porous Material The Model Actuator of Example 3 was used to compare efficacy of carbon black (Vulcan XC72R obtained from Cabot Corporation, Billerica, MA 01821) to that of the CAG of Example 1. About 0.5 g of the CAG of Example 1 or the carbon black, respectively, was loaded into the tube for testing. The force data as presented in FIG. 13 show that the initial force curve for the carbon black powder is slightly less steep than that of the CAG, and that the force values for the carbon black powder drops to a significantly lower value as compared to that of the CAG. It is believed that electrically conductive porous material comprising graphene will provide significant performance benefits as compared to carbon black in actuator environments.

Additionally, electrically conductive porous material comprising graphene may provide operational benefits and purity benefits, since carbon black particles from some sources contain polycyclic aromatic hydrocarbons (PAHs). PAHs over time may gum up the moving cylinders, and therefore cause operation problems over time. In an embodiment, graphene is provided in a chemically pristine form, i.e., with little or no detrimental impurities. In an embodiment, the electrically conductive porous material comprises graphene and is substantially free of contain organic contaminants such as PASs. This embodiment is expected to provide superior overall performance as compared to other electrically conductive porous material.

As used herein, the terms "about" or "approximately" mean within an acceptable range for the particular parameter specified as determined by one of ordinary skill in the art, which will depend in part on how the value is measured or determined, e.g., the limitations of the sample preparation and measurement system. Examples of such limitations include preparing the sample in a wet versus a dry environment, different instruments, variations in sample height, and differing requirements in signal-to-noise ratios. For example, "about" can mean greater or lesser than the value or range of values stated by 1/10 of the stated values, but is not intended to limit any value or range of values to only this broader definition. For instance, a concentration value of about 30% means a concentration between 27% and 33%. Each value or range of values preceded by the term "about" is also intended to encompass the embodiment of the stated absolute value or range of values. Alternatively, particularly with respect to biological systems or processes, the term can mean within an order of magnitude, preferably within 5-fold, and more preferably within 2-fold, of a value.

Throughout this specification and claims, unless the context requires otherwise, the word "comprise", and variations such as "comprises" and "comprising", will be understood to imply the inclusion of a stated integer or step or group of integers or steps but not the exclusion of any other integer or step or group of integer or step. When used herein "consisting of" excludes any element, step, or ingredient not specified in the claim element. When used herein, "consisting essentially of" does not exclude materials or steps that do not materially affect the basic and novel characteristics of the claim. In the present disclosure of various embodiments, any of the terms "comprising", "consisting essentially of" and "consisting of" used in the description of an embodiment may be replaced with either of the other two terms.

All patents, patent applications (including provisional applications), and publications cited herein are incorporated by reference as if individually incorporated for all purposes. Unless otherwise indicated, all parts and percentages are by weight and all molecular weights are weight average molecular weights. The foregoing detailed description has been given for clarity of understanding only. No unnecessary limitations are to be understood therefrom. The invention is not limited to the exact details shown and described, for variations obvious to one skilled in the art will be included within the invention defined by the claims.

What is claimed is:

1. An actuator device comprising:
    an enclosed volume region defined by a housing body and a movable surface, such that at least a portion of the enclosed volume region is expandable from an initial volume state to an enlarged volume state;
    an electrically conductive porous material disposed in the enclosed volume region, wherein the electrically conductive porous material has a mass density of from about 0.5 mg/cc to about 100 mg/cc, wherein at least about 90% of the electrically conductive porous material is a carbonaceous material, wherein the electrically conductive porous material is provided in a physical form selected from the group consisting of a distribution of particles and a distribution of aggregated particles;
    a first electrode and a second electrode configured to pass an electric current through the electrically conductive porous material;
    wherein when an electric current is passed through the electrically conductive porous material, air disposed in the enclosed volume region expands and displaces the movable surface.

2. The actuator device according to claim 1, wherein the carbonaceous material is selected from the group consisting of carbon black, graphite, graphene, and mixtures thereof.

3. The actuator device according to claim 1, wherein the electrically conductive porous material comprises particles in a physical form selected from the group consisting of carbon nanotubes, carbon nanohorns, fullerenes, carbon nanosheets, carbon spheroidal particles, carbon polyhedral particles carbon multilayer sheets comprising from 2 to 30 layers, turbostratic carbon particles, and mixtures thereof.

4. The actuator device according to claim 1, wherein the electrically conductive porous material has a surface area of from about 10 m²/g to about 550 m²/g; or wherein the electrically conductive porous material has a surface area of from about 200 m²/g to about 350 m²/g.

5. The actuator device according to claim 1, wherein the electrically conductive porous material comprises carbonaceous, electrically conductive particles having an average particle size of from about 10 nm to about 150 nm; or wherein the electrically conductive porous material comprises carbonaceous, electrically conductive particles having an average particle size of from about 10 nm to about 100 nm; or wherein the electrically conductive porous material comprises carbonaceous, electrically conductive particles having an average particle size of from about 50 nm to about 100 nm; or wherein the electrically conductive porous material comprises carbonaceous, electrically conductive particles having an average particle size of from about 30 nm to 60 nm.

6. The actuator device according to claim 1, wherein at least about 50% of the electrically conductive porous material is present in the form of carbonaceous, electrically conductive particles having an average particle size of from about 10 nm to about 100 nm; or wherein at least about 60% of the electrically conductive porous material is present in the form of carbonaceous, electrically conductive particles having an average particle size of from about 10 nm to about 100 nm; or wherein at least about 70% of the electrically conductive porous material is present in the form of carbonaceous, electrically conductive particles having an average particle size of from about 10 nm to about 100 nm; or wherein at least about 80% of the electrically conductive porous material is present in the form of carbonaceous, electrically conductive particles having an average particle size of from about 10 nm to about 100 nm; or wherein at least about 90% of the electrically conductive porous material is present in the form of carbonaceous, electrically conductive particles having an average particle size of from about 10 nm to about 100 nm; or wherein at least about 95% of the electrically conductive porous material is present in the form of carbonaceous, electrically conductive particles having an average particle size of from about 10 nm to about 100 nm.

7. The actuator device according to claim 1, wherein the electrically conductive porous material comprises carbonaceous, electrically conductive particles having a mass density of from about 3 mg/cc to about 90 mg/cc, or wherein the electrically conductive porous material comprises carbonaceous, electrically conductive particles having a mass density of from about 10 mg/cc to about 90 mg/cc; or wherein the electrically conductive porous material comprises carbonaceous, electrically conductive particles having a mass density of from about 40 mg/cc to about 90 mg/cc.

8. The actuator device according to claim 1, wherein the enclosed volume region comprises a volume fraction of air of from about 10% to 98%; or wherein the enclosed volume region comprises a volume fraction of air of from about 30% to 98%; or wherein the enclosed volume region comprises a volume fraction of air of from about 50% to 98%; or wherein the enclosed volume region comprises a volume fraction of air of from about 70% to 98%; or wherein the enclosed volume region comprises a volume fraction of air of from about 80% to 98%; or wherein the enclosed volume region comprises a volume fraction of air of from about 90% to 98%; or wherein the enclosed volume region comprises a volume fraction of air of from about 95% to 98%.

9. The actuator device according to claim 1, wherein the electrically conductive porous material has a conductivity of from about 1 S/m to about $5 \times 10^7$ S/m; or wherein the electrically conductive porous material of the actuator device has a conductivity of from about 1 S/m to about 1000 S S/m; or wherein the electrically conductive porous material has a conductivity of from about 1 S/m to about 400 S/m.

10. The actuator device according to claim 1, wherein the electrically conductive porous material comprises carbon black; or wherein from about 1 to 100 wt % of the electrically conductive porous material is carbon black; or wherein from about 20 to 100 wt % of the electrically conductive porous material is carbon black; or wherein from about 20 to 100 wt % of the electrically conductive porous material is carbon black; or wherein from about 40 to 100 wt % of the electrically conductive porous material is carbon black; or wherein from about 60 to 100 wt % of the electrically conductive porous material is carbon black; or wherein from about 80 to 100 wt % of the electrically conductive porous material is carbon black; or wherein from about 90 to 100 wt % of the electrically conductive porous material is carbon black.

11. The actuator device according to claim 1, wherein the electrically conductive porous material comprises coke; or wherein the electrically conductive porous material comprises coke that is derived from coal; or wherein the electrically conductive porous material comprises coke that is derived from oil; or wherein the electrically conductive porous material comprises coke that is metallurgical coke.

12. The actuator device according to claim 1, wherein the electrically conductive porous material comprises graphite; or wherein from about 1 to 100 wt % of the electrically conductive porous material is graphite; or wherein from about 20 to 100 wt % of the electrically conductive porous material is graphite; or wherein from about 20 to 100 wt % of the electrically conductive porous material is graphite; or wherein from about 40 to 100 wt % of the electrically conductive porous material is graphite; or wherein from about 60 to 100 wt % of the electrically conductive porous material is graphite; or wherein from about 80 to 100 wt % of the electrically conductive porous material is graphite; or wherein from about 90 to 100 wt % of the electrically conductive porous material is graphite.

13. The actuator device according to claim 1, wherein the electrically conductive porous material comprises graphene; or wherein from about 1 to 100 wt % of the electrically conductive porous material is graphene; or wherein from about 20 to 100 wt % of the electrically conductive porous material is graphene; or wherein from about 20 to 100 wt % of the electrically conductive porous material is graphene; or wherein from about 40 to 100 wt % of the electrically conductive porous material is graphene; or wherein from about 60 to 100 wt % of the electrically conductive porous material is graphene; or wherein from about 80 to 100 wt % of the electrically conductive porous material is graphene; or wherein from about 90 to 100 wt % of the electrically conductive porous material is graphene.

14. The actuator device according to claim 1, wherein the electrically conductive porous material comprises up to 10 wt. % of non-carbon components; or wherein the electrically conductive porous material comprises up to 10 wt. % of non-carbon components selected from the group consisting of boron, nitrogen, aluminum, silicon, and phosphorous.

15. The actuator device according to claim 1, wherein the electrically conductive porous material is free of polycyclic aromatic hydrocarbons (PAHs).

16. The actuator device according to claim 1, wherein the movable surface comprises a piston moveable within the housing body.

17. The actuator device according to claim 1, wherein the first electrode and the second electrode are disposed on opposing portions of the housing and facing the enclosed volume region.

18. The actuator device according to claim 1, wherein the housing body is a cylindrical body having a circular cross-section comprising a first base circular base, and the movable surface is a circular piston fitted to the cylindrical body.

19. The actuator device according to claim 18, wherein the first electrode is disposed on the first base circular base on a surface facing the enclosed volume region and the second electrode is disposed adjacent the circular piston on a surface facing the enclosed volume region and comprises void regions to allow air to pass therethrough.

20. The actuator device according to claim 1, wherein the movable surface comprises a displaceable wall of the housing body configured to be displaced by expansion of the air disposed in the enclosed volume region.

21. The actuator device according to claim 1, wherein the housing body is fabricated from a material selected from the group consisting of glass, borosilicate glass, ceramic, quartz, and a composite structure ceramic.

22. The actuator device according to claim 1, wherein the device is configured to apply an electric potential across the first electrode and the second electrode of from about 1V to about 240V; or wherein the device is configured to apply an electric potential across the first electrode and the second electrode of from about 2V to about 10V; or wherein the device is configured to apply an electric potential across the first electrode and the second electrode of from about 5V to about 15V.

23. The actuator device according to claim 1, wherein the device is configured to apply an electric potential across the first electrode and the second electrode using DC voltage.

24. The actuator device according to claim 1, wherein the device is configured to apply an electric potential across the first electrode and the second electrode using AC voltage.

25. The actuator device according to claim 1, wherein the housing is insulated to reduce heat loss during actuation.

26. The actuator device according to claim 1, wherein the housing enclosed volume region has an initial volume of from about 1 cc to about 1000 cc or wherein the housing enclosed volume region has an initial volume of from about 1 cc to about 1000 cc, or wherein the housing enclosed volume region has an initial volume of from about 3 cc to about 300 cc, or wherein the housing enclosed volume region has an initial volume of from about 3 cc to about 200 cc, or wherein the housing enclosed volume region has an initial volume of from about 3 cc to about 100 cc, or wherein the housing enclosed volume region has an initial volume of from about 3 cc to about 50 cc.

27. The actuator device according to claim 1, wherein the electrically conductive porous material is selected to provide expansion of the enclosed volume region at least about 10% when an electric current is passed through the electrically conductive porous material; or wherein the electrically conductive porous material is selected to provide expansion of the enclosed volume region at least about 50% when an electric current is passed through the electrically conductive porous material; or wherein the electrically conductive porous material is selected to provide expansion of the enclosed volume region at least about 100% when an electric current is passed through the electrically conductive porous material; or wherein the electrically conductive porous material is selected to provide expansion of the enclosed volume region at least about 200% when an electric current is passed through the electrically conductive porous material.

28. The actuator device according to claim 1, wherein the enclosed volume region is a closed system.

29. A method of displacing a movable surface in an actuator device, comprising providing the actuator device of claim 1, and
applying an electric potential across the first electrode and the second electrode in an amount sufficient to expand the air disposed in the enclosed volume region and displace the movable surface.

30. The actuator device according to claim 1, wherein the electrically conductive porous material of the actuator device has a conductivity of from about 1000 S/m to about $5 \times 10^7$ S/m; or wherein the electrically conductive porous material of the actuator device has a conductivity of from about $1 \times 10^4$ S/m to about $5 \times 10^7$ S/m; or wherein the electrically conductive porous material of the actuator device has a conductivity of from about $1 \times 10^5$ S/m to about $5 \times 10^7$ S/m; or wherein the electrically conductive porous material of the actuator device has a conductivity of from about $1 \times 10^6$ S/m to about $5 \times 10^7$ S/m.

* * * * *